(12) United States Patent
Munn et al.

(10) Patent No.: US 11,872,650 B2
(45) Date of Patent: Jan. 16, 2024

(54) SYSTEMS AND METHODS FOR FRICTION STIR WELDING A COLD PLATE

(71) Applicant: LOCKHEED MARTIN CORPORATION, Bethesda, MD (US)

(72) Inventors: David James Munn, Owego, NY (US); Leon E. Benjamin, Owego, NY (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 610 days.

(21) Appl. No.: 16/875,057

(22) Filed: May 15, 2020

(65) Prior Publication Data

US 2021/0354230 A1 Nov. 18, 2021

(51) Int. Cl.
*B23K 20/12* (2006.01)

(52) U.S. Cl.
CPC ........ *B23K 20/1255* (2013.01); *B23K 20/127* (2013.01); *B23K 20/1265* (2013.01)

(58) Field of Classification Search
CPC ............ B23K 20/1255; B23K 20/1265; B23K 20/127; B23K 2101/14; B23K 2103/08; B23K 20/122–128; B23P 2700/10; B23P 15/26; H01L 21/4871
USPC .............................................. 228/112.1, 2.1
See application file for complete search history.

(56) References Cited

U.S. PATENT DOCUMENTS

| | | | |
|---|---|---|---|
| 10,661,379 B1* | 5/2020 | Larsson | B23K 37/08 |
| 2002/0153130 A1 | 10/2002 | Okamoto et al. | |
| 2004/0194942 A1* | 10/2004 | Okamoto | B23K 20/122 165/170 |
| 2005/0051601 A1* | 3/2005 | Ezumi | B23K 20/122 228/2.1 |
| 2005/0199372 A1 | 9/2005 | Frazer et al. | |
| 2007/0163120 A1* | 7/2007 | Okamoto | B23P 15/26 29/890.054 |
| 2010/0314075 A1* | 12/2010 | Takahashi | B23K 20/122 29/890.035 |
| 2015/0291273 A1* | 10/2015 | Elze | B23K 31/02 228/114 |
| 2018/0164049 A1 | 6/2018 | Okuaki et al. | |
| 2018/0200829 A1* | 7/2018 | Campbell | B23K 20/122 |
| 2018/0243858 A1* | 8/2018 | Hori | B23K 20/1225 |
| 2018/0250767 A1* | 9/2018 | Hori | B23K 20/124 |

(Continued)

FOREIGN PATENT DOCUMENTS

| | | | | |
|---|---|---|---|---|
| EP | 3342525 A1 | 7/2018 | | |
| JP | 2015131321 A * | 7/2015 | ......... | B23K 20/1235 |

(Continued)

OTHER PUBLICATIONS

International Search Report and Written Opinion for Application No. PCT/US2021/032442 dated Sep. 17, 2021 (20 pages).

*Primary Examiner* — Kiley S Stoner
(74) *Attorney, Agent, or Firm* — Michael Best & Friedrich LLP

(57) ABSTRACT

Methods and systems for providing a cold plate assembly include providing a base and a cover. The cover can be fixedly coupled to the base. Each of the base and the cover can include spaced internal ribs, which can form flow paths when the base and cover are fixedly coupled together. The internal ribs of the base and the cover can have spaced tabs that can be fixedly coupled to the other of the base or the cover. The base and the cover may also include spaced external or outer sacrificial ribs.

15 Claims, 10 Drawing Sheets

(56) References Cited

U.S. PATENT DOCUMENTS

2018/0272479 A1    9/2018  Hori et al.
2020/0353557 A1*  11/2020  Hori .................... B23K 20/122

FOREIGN PATENT DOCUMENTS

| | | | | |
|---|---|---|---|---|
| JP | 2017042817 A * | 3/2017 | ......... | B23K 20/1255 |
| WO | WO-2014131670 A2 * | 9/2014 | ............ | B21C 23/18 |
| WO | WO-2019123678 A1 * | 6/2019 | ........... | B23K 20/122 |
| WO | WO-2019198290 A1 * | 10/2019 | ........... | B23K 20/002 |
| WO | WO-2020085389 A1 * | 4/2020 | ............ | B23K 20/12 |
| WO | WO-2020095483 A1 * | 5/2020 | ........... | B23K 20/122 |

* cited by examiner

SYSTEMS AND METHODS FOR FRICTION STIR WELDING A COLD PLATE

SUMMARY

Embodiments of the disclosed subject matter involve the manufacture of a cold plate, particularly systems and methods for making and assembling a large surface area cold plate.

According to one or more embodiments of the disclosed subject matter, a method for manufacturing a cold plate assembly can be implemented. The method can comprise providing a base plate including: a first set of spaced outer sacrificial ribs on a first side and a first set of spaced internal ribs on a second side opposing the first side, an inner perimeter wall having a lip defining a reception area for a perimeter edge of a cover plate, a first plurality of spaced tabs on each said internal rib of the base plate, and a first plurality of spaced slots through the base plate between adjacent pairs of the outer sacrificial and internal ribs; providing a cover plate including: a second set of spaced outer sacrificial ribs on a third side and a second set of spaced internal ribs on a fourth side opposing the third side, a second plurality of spaced tabs on each said internal rib of the cover plate, and a second plurality of spaced slots through the cover plate between adjacent pairs of the outer sacrificial and internal ribs, wherein each said slot of the second plurality of slots is spaced so as to register with a corresponding tab of the first plurality of tabs, and wherein each said slot of the first plurality of slots is spaced so as to register with a corresponding tab of the second plurality of tabs; inserting each said tab of the first plurality of tabs into the corresponding slot of the second plurality of slots; inserting each said tab of the second plurality of tabs into the corresponding slot of the first plurality of slots; fitting the perimeter edge of the cover plate within the lip of the perimeter wall; friction stir tack welding, with a partial penetration pin tool head, between the spaced outer sacrificial ribs of the first side and the third side, wherein said friction stir tack welding melds each said tab to a corresponding slot; friction stir welding, with a full penetration friction stir welding head, the perimeter edge of the cover plate within the lip of the perimeter wall, the perimeter edge of the cover plate to the base plate; and removing, by a milling machine, the outer sacrificial ribs of the cover plate and the base plate.

Additionally, one or more embodiments of the disclosed subject matter can provide or implement a cold plate assembly. The cold plate assembly can comprise a base plate having spaced external sacrificial ribs on a first side and spaced internal ribs on a second side opposing the first side, the internal ribs being at least partially aligned with respective ones of the external ribs in a thickness direction of the base plate; a cover plate having spaced external sacrificial ribs on a third side and spaced internal ribs on a fourth side opposing the third side, the internal ribs being at least partially aligned with respective ones of the external ribs in a thickness direction of the cover plate, the base plate having a ledge that defines a reception area configured to receive a perimeter edge of the cover plate; a first plurality of spaced tabs located on each said internal rib of the base plate, each said tab of the first plurality of tabs extending from the corresponding internal rib in the thickness direction of the base plate; a second plurality of spaced tabs located on each said internal rib of the cover plate, each said tab of the second plurality of tabs extending from the corresponding internal rib in the thickness direction of the cover plate; a first plurality of spaced slots located between adjacent pairs of the external sacrificial and internal ribs of the base plate, wherein each said slot of the first plurality of slots is located so as to register with and receive a corresponding tab of the internal ribs of the cover plate; and a second plurality of spaced slots located between adjacent pairs of the external sacrificial and internal ribs of the cover plate. Each said slot of the second plurality of slots can be located so as to register with and receive a corresponding tab of the internal ribs of the base plate, each said tab, when inserted into a corresponding one of the slots, can be configured to be friction stir tack welded to fixedly couple the cover plate to the base plate, and the perimeter edge of the cover plate, when received in the ledge of the base plate, can be configured to be friction stir welded to the ledge of the base plate.

In another exemplary embodiment, a method for assembling a cold plate can be implemented. The method can comprise connecting ribs on a first side of a base plate to a cover plate; connecting ribs on a second side of the cover plate facing the first side of the base plate to the base plate; and fitting a side edge portion of the cover plate on a lip of an inner sidewall of the base plate.

Embodiments can also include methods of providing, making, and/or using apparatuses and systems, or portions thereof, according to one or more embodiments of the disclosed subject matter.

The preceding summary is to provide an understanding of some aspects of the disclosure. As will be appreciated, other embodiments of the disclosure are possible utilizing, alone or in combination, one or more of the features set forth above or described in detail below. Also, while the disclosure is presented in terms of exemplary embodiments, it should be appreciated that individual aspects of the disclosure can be separately claimed.

Additionally, the foregoing general description of the illustrative embodiments and the following detailed description thereof are merely exemplary aspects of the teachings of this disclosure, and are not restrictive.

BRIEF DESCRIPTION OF THE DRAWINGS

The accompanying drawings, which are incorporated in and constitute a part of the specification, are illustrative of one or more embodiments of the disclosed subject matter, and, together with the description, explain various embodiments of the disclosed subject matter. Further, the accompanying drawings have not necessarily been drawn to scale, and any values or dimensions in the accompanying drawings are for illustration purposes only and may or may not represent actual or preferred values or dimensions. Where applicable, some or all select features may not be illustrated to assist in the description and understanding of underlying features.

DETAILED DESCRIPTION

Figure 1:
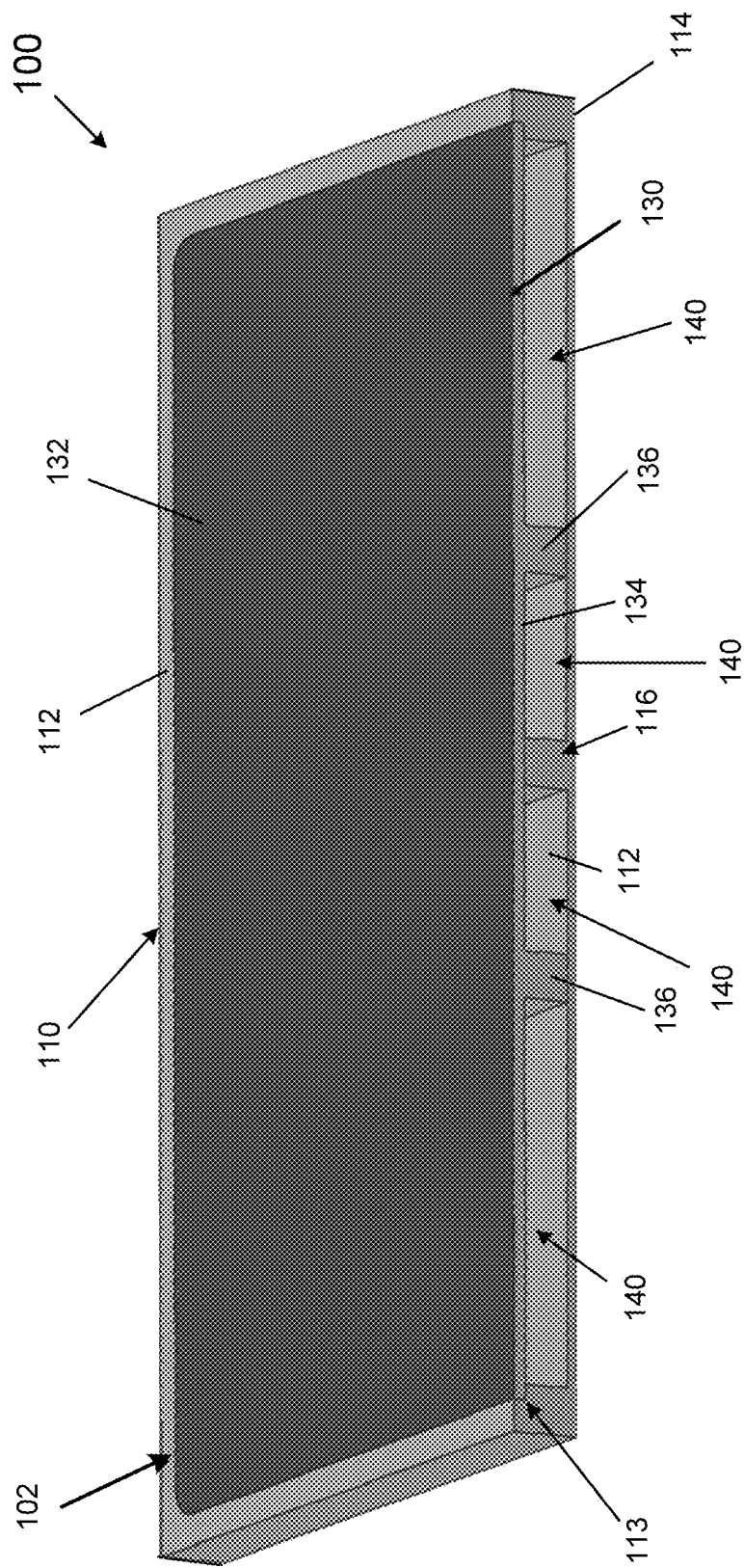
FIG. 1 shows a cross section of a cold plate (or cold plate assembly) according to one or more embodiments of the disclosed subject matter.

The description set forth below in connection with the appended drawings is intended as a description of various embodiments of the described subject matter and is not necessarily intended to represent the only embodiment(s). In certain instances, the description includes specific details for the purpose of providing an understanding of the described subject matter. However, it will be apparent to those skilled in the art that embodiments may be practiced without these specific details. In some instances, structures and components may be shown in block diagram form in order to avoid obscuring the concepts of the described subject matter. Wherever possible, the same reference numbers will be used throughout the drawings to refer to the same or the like parts.

Any reference in the specification to "one embodiment" or "an embodiment" means that a particular feature, structure, characteristic, operation, or function described in connection with an embodiment is included in at least one embodiment. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments, and it is intended that embodiments of the described subject matter can and do cover modifications and variations of the described embodiments.

It must also be noted that, as used in the specification, appended claims and abstract, the singular forms "a," "an," and "the" include plural referents unless the context clearly dictates otherwise. That is, unless clearly specified otherwise, as used herein the words "a" and "an" and the like carry the meaning of "one or more" or "at least one." The phrases "at least one," "one or more," "or," and "and/or" are open-ended expressions that can be both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" can mean A alone, B alone, C alone, A and B together, A and C together, B and C together, or A, B and C together. It is also to be noted that the terms "comprising," "including," and "having" can be used interchangeably.

It is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the described subject matter to any particular orientation or configuration. Furthermore, terms such as "first," "second," "third," etc. merely identify one of a number of portions, components, points of reference, operations and/or functions as described herein, and likewise do not necessarily limit embodiments of the described subject matter to any particular configuration or orientation.

Embodiments of the present disclosure are directed to a method for manufacturing a cold plate, a cold plate assembly, and a method for assembling a cold plate.

Cold plates, which can be used to provide cooling via circulation of coolant, may be implemented in a wide range of applications such as radar systems, power electronics, and high-performance computing. During assembly, thin cooling surfaces may be susceptible to distortion during welding processes to fixedly couple cooling bodies to form opposing surfaces of the cold plate. For example, shrinkage stress from the welding processes may cause distortion. An additional challenge during the welding processes can be the need to keep a cover of the cold plate reliably held against the base of the cold plate. However, it may be desirable to clamp the cover to the base without impeding the welding path (and hence preventing a continuous weld path and welding).

FIG. 1 shows a cross section of a cold plate (or cold plate assembly) 100 according to one or more embodiments of the disclosed subject matter.

Generally, cold plates according to embodiments of the disclosed subject matter, such as cold plate 100, can comprise two relatively large, flat surfaces on opposing sides of the assembly (e.g., up to 3.3 m length and/or width), with a relatively small thickness (e.g., 13 mm). The cold plate 100 can be comprised of a base 110 and a cover 130. Hence, such flat surfaces can be formed by the base 110 and the cover 130. In that each of the base 110 and the cover 130 can be relatively thin, the base 110 and the cover 130 may be referred to as a base plate 110 and a cover plate 130, respectively.

The base 110 can have one or more internal ribs 116 (FIG. 1 shows one internal rib 116), which can extend from a second side 114 of the base 110 opposite a first side 112 of the base 110. Likewise, the cover 130 can have one or more internal ribs 136 (FIG. 1 shows two internal ribs 136), which can extend from a second side 134 of the cover 130 opposite a first side 132 of the cover 130. The internal ribs 116, 136 can be spaced from each other in a first direction, and may run or extend in a second direction perpendicular to the first direction. Note that since the base 110 may define an inner void or volume, the first side 112 of the base 110 may have a portion considered internal and a portion considered external. As shown in FIG. 1, for instance, the external portion of the first side 112 of the base 110 can be provided around a perimeter of the cold plate 100.

One or more flow channels or paths (or flow channel/path portions) 140 may be provided, between pairs of adjacent internal ribs 116 of the base 110 and internal ribs 136 of the cover 130. Such flow paths 140 may be to circulate coolant in the internal volume of the cold plate 100 and hence cool the flat outer surfaces of the cold plate 100.

The base 110 may also have or define a cutout or lip 113 around an inner periphery portion thereof that defines an upper edge of the inner void or volume of the base 110. The lip 113 may be characterized as a shelf or ledge and configured to receive a peripheral or perimeter portion of the cover 130, such as shown in FIG. 1. According to embodiments of the disclosed subject matter, upper surfaces of the base 110 and the cover 130 where the peripheral portion of the cover 130 interfaces with the lip 113 may be flush.

The cover 130 can be fixedly coupled to the base 110. In particular, the cover 130 can be fixedly coupled to the base 110 at a perimeter seam 102, an upper portion of each internal rib 116 of the base 110 can be fixedly coupled to the second side 134 of the cover 130, and a lower portion of each internal rib 136 of the cover 130 can be fixedly coupled to the first side 112 of the base 110. The perimeter seam 102 can be created via a friction stir welding (FSW) process. Likewise, the internal ribs 116, 136 can be fixedly coupled to the cover 130 and base 110, respectively, via a friction stir welding process.

Friction stir welding (FSW), generally speaking, is a solid-state joining process that uses a non-consumable tool to join two workpieces without melting the workpiece materials (e.g., metals). Heat is generated by friction between the rotating tool and the workpiece materials, which leads to a softened region near the tool. When the tool traverses along a joint line or otherwise joining interface, the material(s) of the two workpieces can be intermixed by forging the hot and softened material by the mechanical pressure of the tool.

In friction stir welding, a rotating cylindrical tool with a profiled probe can be fed into a number of joints, including a butt joint, a lap joint, a butt-lap joint, and a fillet joint, between two workpieces (e.g., clamped), until the shoulder, which has a larger diameter than the pin, touches the surface of the workpieces. In the present disclosure, the perimeter weld can be a butt-lap joint and the inner ribs welds can be lap welds. Optionally, the probe can be slightly longer than the weld depth required, with the tool shoulder riding atop the work surface. Though in other applications the probe may be shorter than the required weld depth. After a short dwell time, the tool can be moved forward along the joint line at a pre-set welding speed.

Heat from friction between the wear-resistant welding tool and the workpiece causes the sheet or plate to soften without reaching the melting point. The softened material can be transferred to the trailing edge of the tool pin as the tool moves along the weld line by the pin geometry. The material can be forged by the intimate contact of the tool shoulder and the pin profile. After cooling, a solid phase bond is created between the pieces of material (e.g., metal) that have been "stirred together." This process can join materials without the need for a filler material (e.g., metal) or shielding gas.

Friction stir welding (FSW) for cold plates can offer increased mechanical and thermal properties over alternatives. For instance, the solid-state nature of FSW can lead to advantages over fusion welding methods, as problems associated with cooling from the liquid phase can be avoided. Issues such as porosity, solute redistribution, solidification cracking, and liquidation cracking do not arise during FSW. In general, FSW has been found to produce a low concentration of defects and is tolerant to variations in parameters and materials.

Figure 2A:
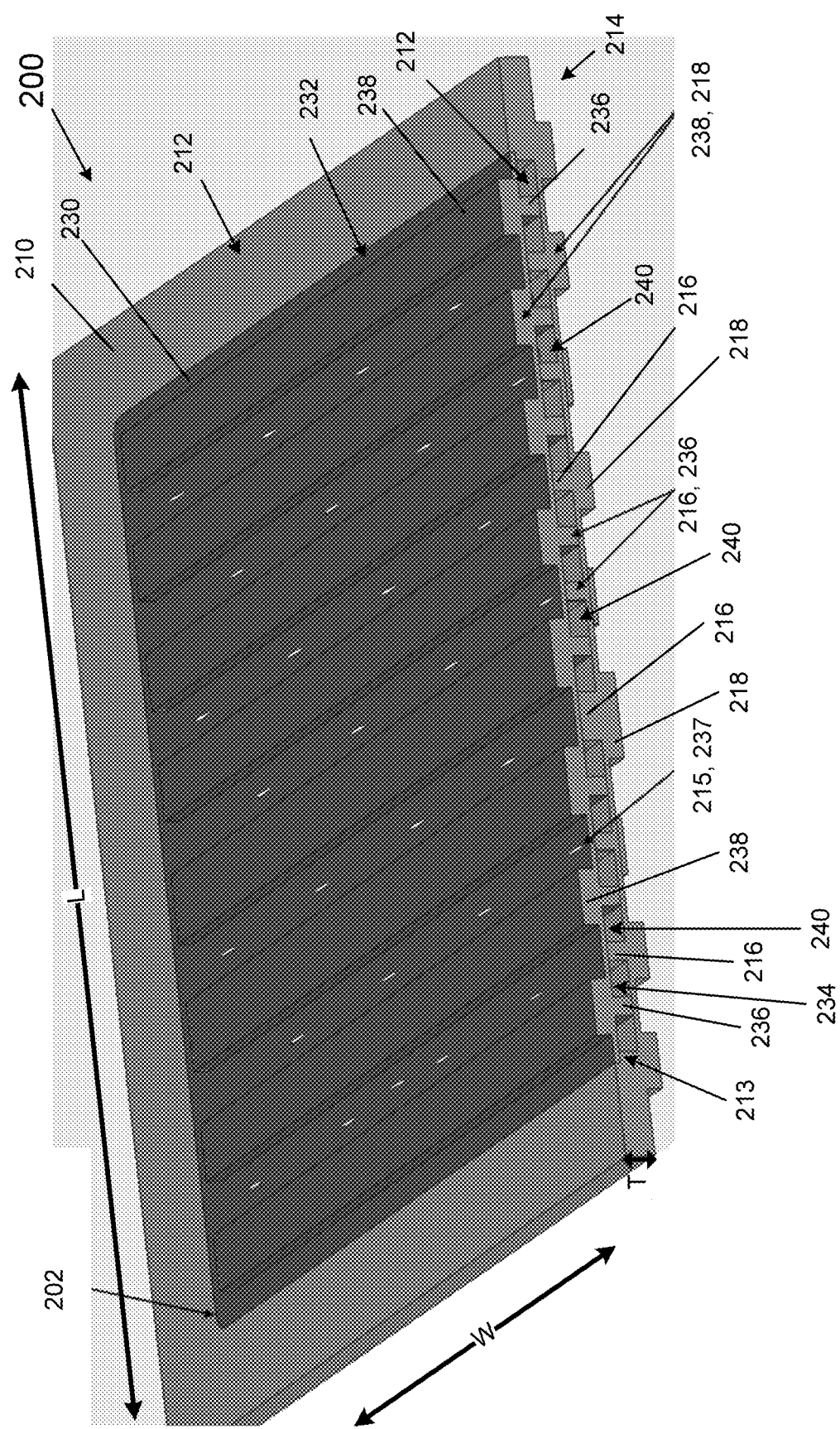
FIG. 2A shows a cross section of a cold plate (or cold plate assembly) in intermediate form according to one or more embodiments of the disclosed subject matter.

FIG. 2A shows a cross section of a cold plate (or cold plate assembly) 200 in intermediate form according to one or more embodiments of the disclosed subject matter.

Similar to the cold plate 100 of FIG. 1, the cold plate 200 can have a base 210 and a cover 230. The cold plate 200 can include a plurality internal ribs, including a plurality of internal ribs 216 of the base 210 and a plurality of internal ribs 236 of the cover 230. The internal ribs 216 can extend from or at a first side 212 of the base 210, and the internal ribs 236 can extend from or at a second side 234 of the cover 230. As shown in FIG. 2A, for instance, the external portion of the first side 212 of the base 110 can be provided around a perimeter of the cold plate 200.

The internal ribs 216 and the internal ribs 236 may alternate, such as shown in FIG. 2A, and respective pairs of adjacent internal ribs 216, 236 may form a flow channel or path (or flow channel/path portion) 240 therebetween. Thus, the internal ribs 216 may be spaced from each other in a first direction, the internal ribs 236 may be spaced from each other in the first direction, and the internal ribs 216, 236 may be spaced from each other in the first direction.

One or more flow paths (or flow path portions) 240 may be provided, between pairs of adjacent pairs of internal ribs 216 of the base 210 and internal ribs 236 of the cover 230. Such flow paths 240 may be to circulate coolant in the internal volume of the cold plate 200 and hence cool the flat outer surfaces of the cold plate 200.

The base 210 may also have a plurality of external or outer ribs 218, and the cover 230 can have a plurality of external or outer ribs 238. The external ribs 218 can extend from or at a second side 214 of the base 210, and the external ribs 238 can extend from or at first side 232 of the cover 230. During a process (or processes) of fixedly coupling the cover 230 to the base 210, such as one or more friction stir welding processes, the external ribs 218 and the external ribs 238 may stiffen the base 210 and cover 230, respectively, which may minimize or prevent cupping and distortion. The external ribs 218 and the external ribs 238 may also serve as a heat sink to assist with maintaining a consistent thermal profile during the fixing process(es) (e.g., one or more friction stir welding processes). The external ribs 218 and the external ribs 238 may be called or characterized as sacrificial ribs in that, optionally, each may be removed, for instance, via machining (e.g., grinding, milling, etc.), after the cover 230 is fixed to the base 210, to produce flat or substantially flat opposing surfaces, such as shown in the cold plate 100 of FIG. 1.

The external ribs 218 and the external ribs 238 can run or extend in a second direction perpendicular to a first direction in which the external ribs 218, 238 are separated. Optionally, the external ribs 218 may overlap or be aligned with fully or partially a corresponding internal rib 216. Likewise, optionally, external ribs 238 may overlap or be aligned with fully or partially a corresponding internal rib 236. The geometries of the internal ribs 216 may be the same or different. For instance, FIG. 2A shows a centrally located internal rib 216 being wider than other internal ribs 216. Likewise, the geometries of the internal ribs 236 may be the same or different.

The base 210 may also have or define a cutout or lip 213 around an inner periphery portion thereof that defines an upper edge of the inner void or volume of the base 210. The lip 213 may be characterized as a shelf or ledge and configured to receive a peripheral or perimeter portion of the cover 230, such as shown in FIG. 2A. According to embodiments of the disclosed subject matter, upper surfaces of the base 210 and the cover 230 where the peripheral portion of the cover 230 interfaces with the lip 213 may be flush. The cover 230 can be fixedly coupled to the base 210 where the peripheral portion of the cover 230 interfaces with the lip 213, for instance, via a friction stir welding process, according to a perimeter seam 202, which can be continuous around the interface.

Figure 2B:
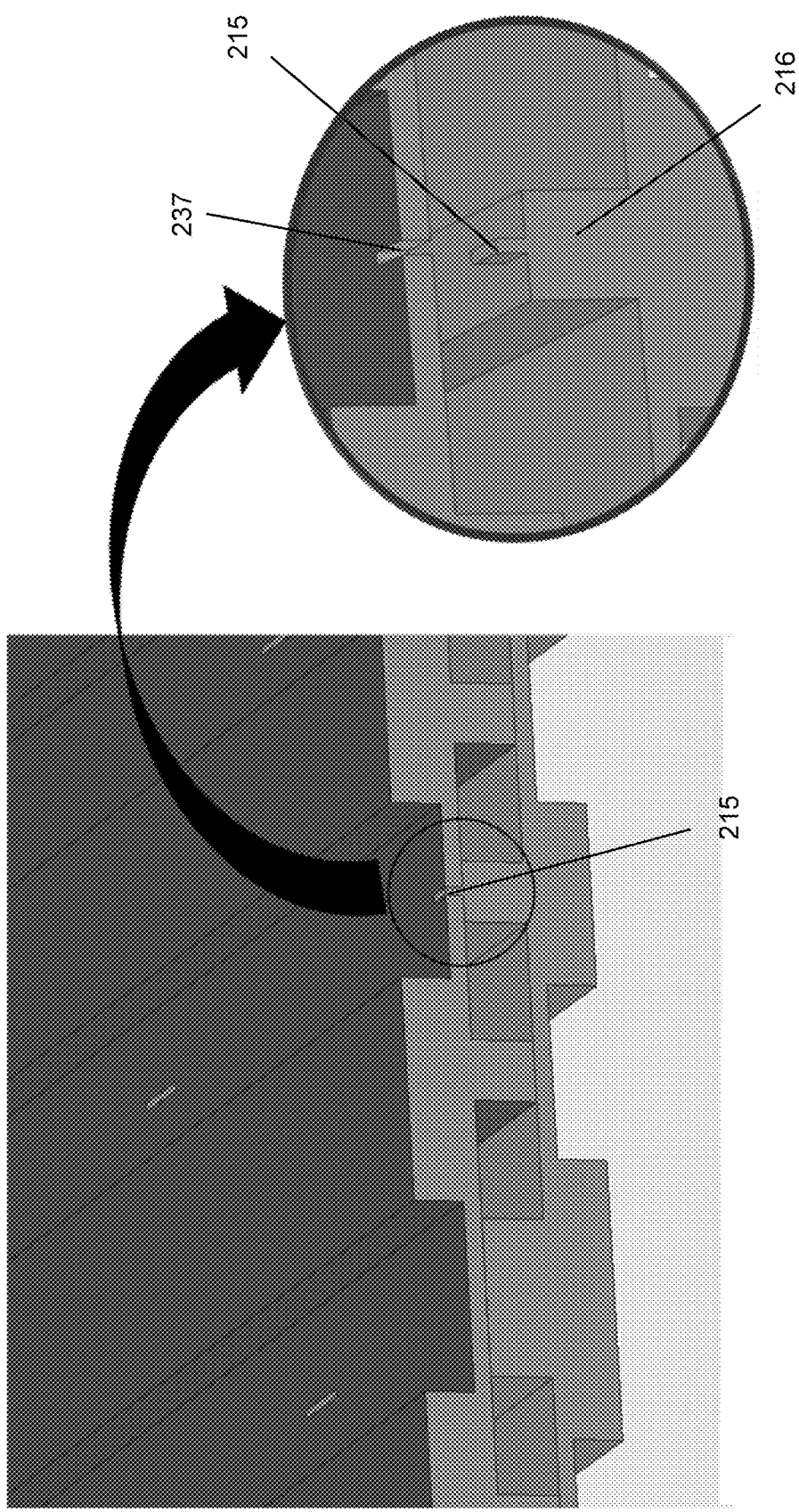
FIG. 2B shows enlarged sectional views of the cold plate of FIG. 2A.

The cover 230 can include a plurality of cutouts or slots 237, a plurality of which may be provided in spaced relation between adjacent pairs of internal ribs 236 and external ribs 238. A plurality of projections or tabs 215 can be provided at or extending from upper surfaces of each of the internal ribs 216. As shown in FIG. 2A and FIG. 2B, the tabs 215 can be received or registered in respective slots 237. Likewise, the base 210 can include a plurality of cutouts or slots (not expressly shown), a plurality of which may be provided in spaced relation between adjacent pairs of internal ribs 216 and external ribs 218. A plurality of projections or tabs (not expressly shown) can be provided at or extending from lower surfaces of each of the internal ribs 236, and can be received or registered in respective slots in the base 210.

The tabs of the internal ribs 216, 236, which received by respective slots, can be respectively fixedly coupled to the opposing cover 230 or base 210, via a friction stir tack welding process. Thus, the base 210 and the cover 230 can be fixedly coupled to each other (e.g., via friction stir welding) from both sides of the cold plate 200, which may even out shrinkage stresses. The tabs/slots arrangement can assist with reliably holding the cover 230 to the base 210 during one or more operations to fixedly couple the cover 230 to the base 210, such as one or more friction stir welding processes.

The base 210 can be provided according to the configuration shown in FIG. 2A by machining, molding, or additive manufacturing fully or partially (e.g., the internal ribs 216 and the external ribs 218). Likewise, the cover 230 can be created provided according to the configuration shown in FIG. 2A by machining, molding, or additive manufacturing fully or partially (e.g., the internal ribs 236 and the external ribs 238). In a preferred embodiment, the base 210 can be machined from an aluminum block and the cover 230 can be constructed from aluminum sheet metal. However, portions of the cold plate 200 may be constructed from any one of copper, silver, or a silver/copper alloy.

Figure 3A:
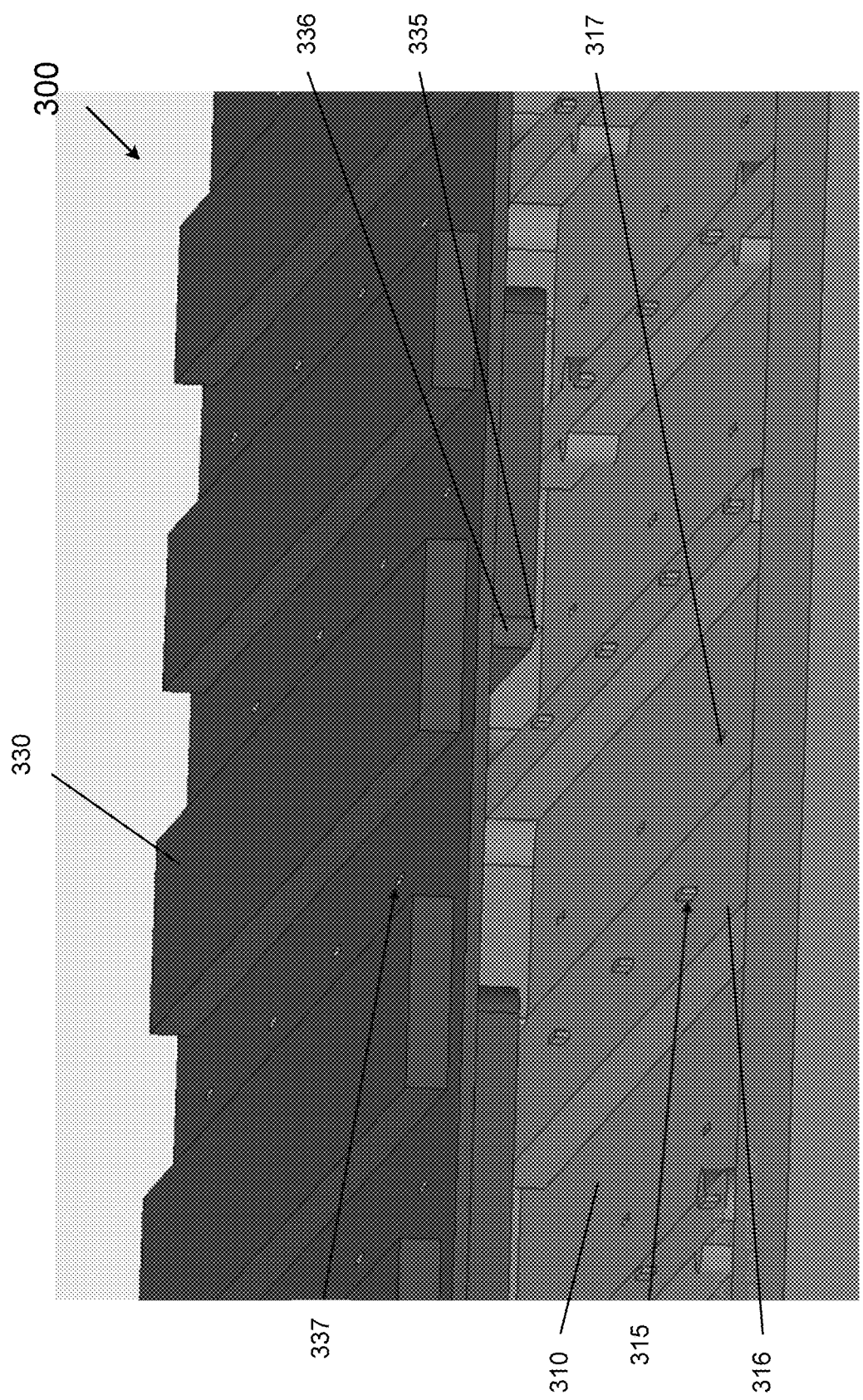
FIG. 3A shows an assembly view of a portion of a cold plate (or cold plate assembly) according to one or more embodiments of the disclosed subject matter.
Figure 3B:
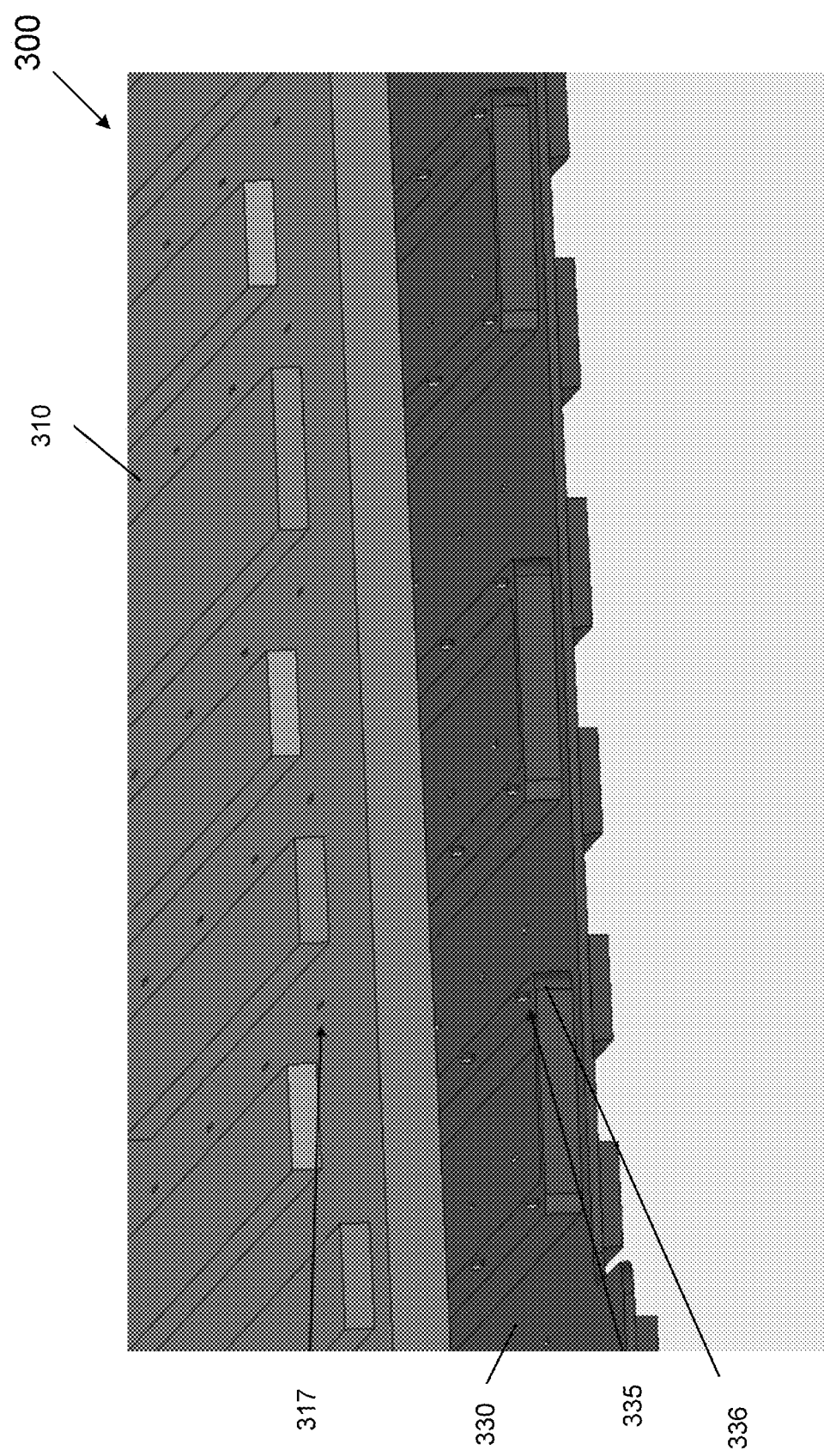
FIG. 3B shows another assembly view of a portion of the cold plate (or cold plate assembly) of FIG. 3A.

FIG. 3A and FIG. 3B show assembly views of a portion of a cold plate (or cold plate assembly) 300 according to one or more embodiments of the disclosed subject matter. Notably, FIG. 3A and FIG. 3B, in addition to showing slots 337 and corresponding tabs 315, also show tabs 335 on internal ribs 336 of cover 330 and corresponding slots 317 in base 310. The slots 337 can be fitted onto tabs 315, and the tabs 335 can be fitted into corresponding slots 317. As noted above, registration of the slots and tabs can align the cover 330 to the base 310 during one or more processes to fix the cover 330 to the base 310, such as one or more friction stir welding processes around the perimeter of the cover 330 (e.g., using a large friction stir welding pin tool) and to the pairs of tabs and slots between external ribs on the cover 330 and the base 310 (e.g., small friction stir tack welding pin tool).

Figure 4B:
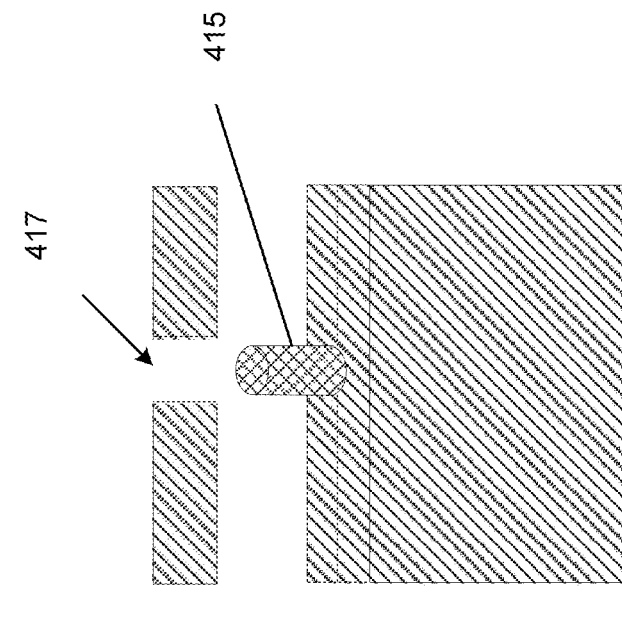
FIGS. 4A-4B are diagrammatic assembly views of connection interfaces for a portion of a cold plate (or cold plate assembly) according to one or more embodiments of the disclosed subject matter.
Figure 4A:
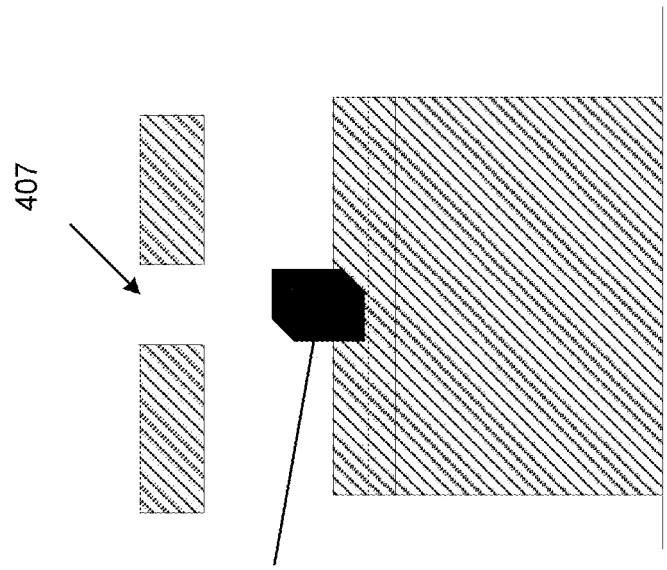

FIGS. 4A and 4B are diagrammatic assembly views of connection interfaces for a portion of a cold plate (or cold plate assembly) according to one or more embodiments of the disclosed subject matter. As shown, the geometries of pairs of tabs and slots can take a number of forms.

For instance, in an embodiment, some or all of the tabs 405 and corresponding slots 407 can be rectangular, such as diagrammatically shown in FIG. 4A. In another example, some or all of the tabs 415 and corresponding slots 417 can be cylindrical, such as diagrammatically shown in FIG. 4B. The height of the tabs can be equal to or slightly greater than that of the corresponding slots.

Figure 5:
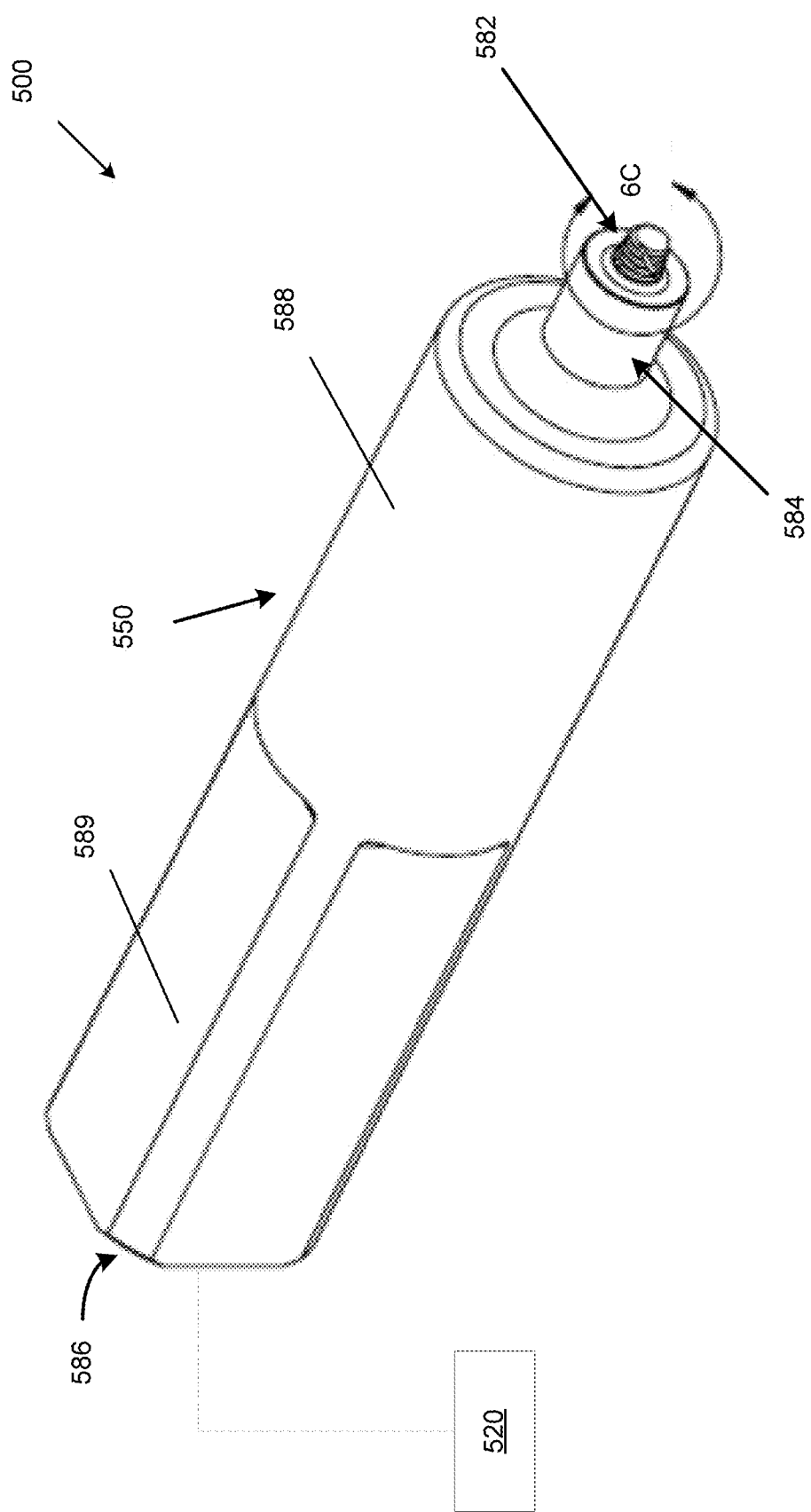
FIG. 5 is a diagram of a system for manufacturing a cold plate (or cold plate assembly) according to one or more embodiments of the disclosed subject matter.

FIG. 5 is a diagram of a system 500 for manufacturing a cold plate (or cold plate assembly) according to one or more embodiments of the disclosed subject matter.

The system 500 can be comprised of a controller 520 and a tool 550. The tool 550 can be a friction stir weld (FSW) pin tool, and FIG. 5 and FIGS. 6A-6C show a friction stir weld (FSW) pin tool or portions thereof according to embodiments of the disclosed subject matter. The friction stir weld pin tool, according to embodiments of the disclosure, may be a penetration (full or partial) FSW pin tool.

Figure 6A:
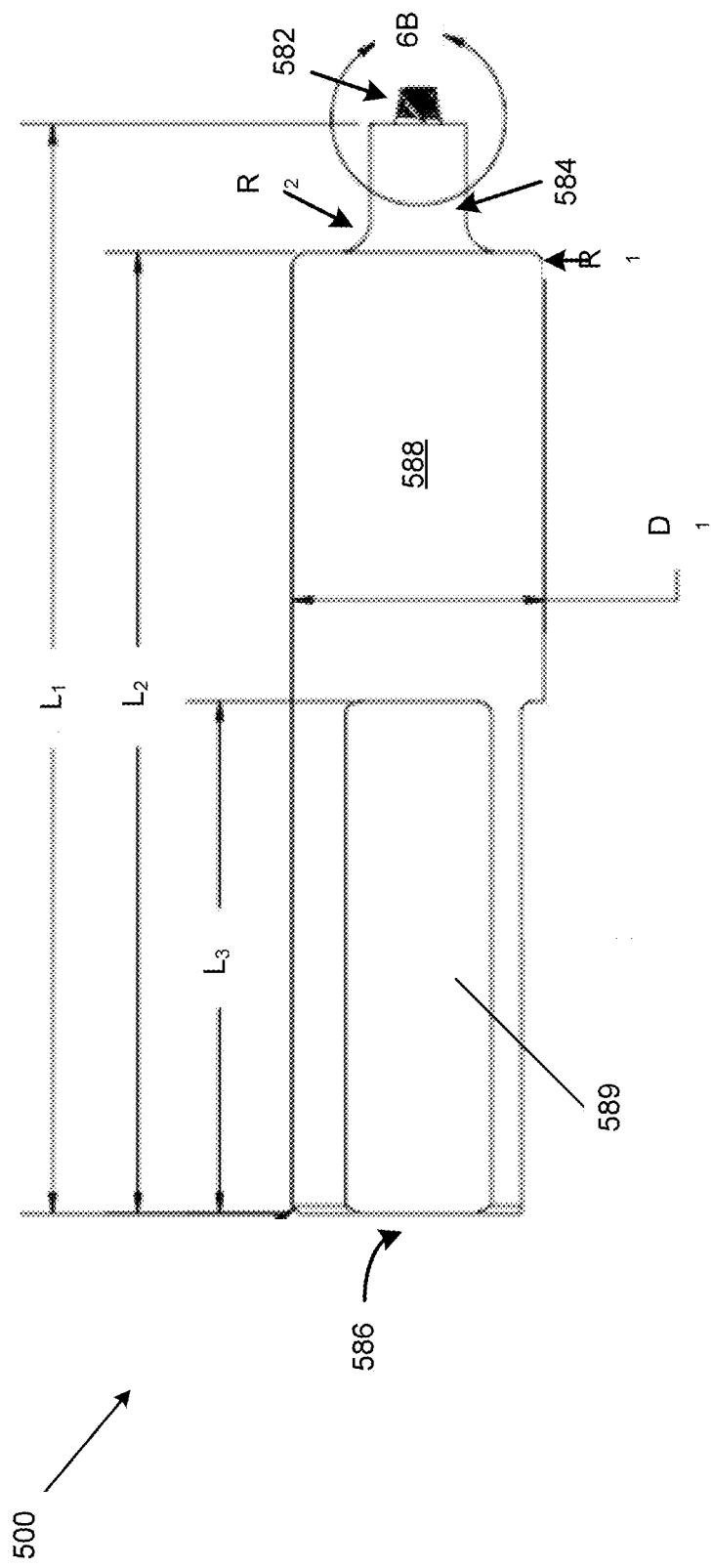
FIGS. 6A-6C show schematic views of a friction stir weld (FSW) pin tool or portions thereof of the system of FIG. 5.
Figure 6B:
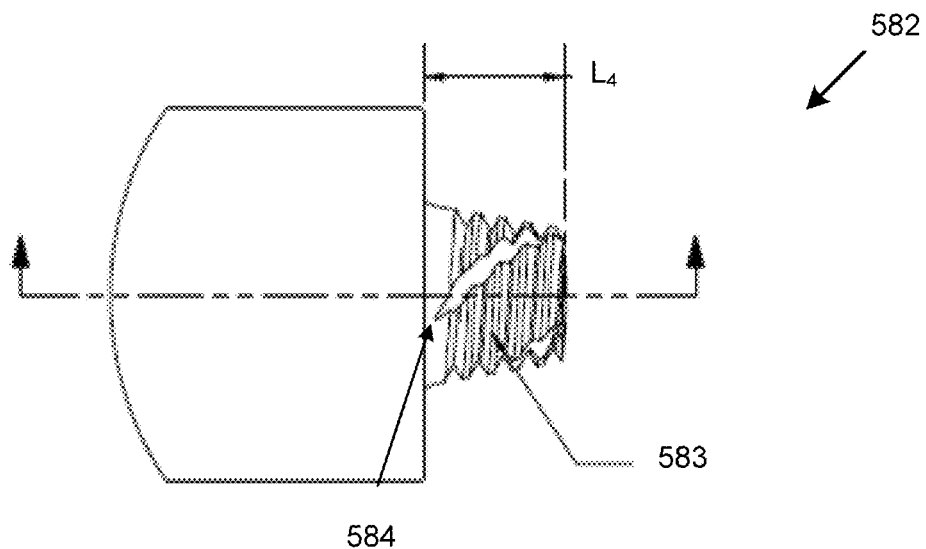
Figure 6C:
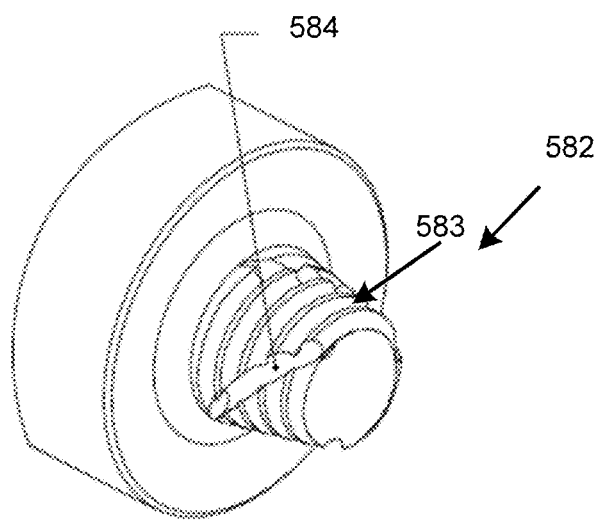

The controller 520 can be operatively coupled to the tool 550 via wired and/or wired communication connections. Generally, the controller 520 can control operations of the tool 550. FIGS. 6A-6C show schematic views of a friction stir weld (FSW) pin tool or portions thereof of the system of FIG. 5.

Generally, the tool 550, under control of the controller 520, for instance, can be used to fixedly connect a cover to a base, such as the covers and bases discussed above for FIGS. 1-4B.

The distal end is labeled 586 and the tool pin at the proximal end is labeled 582. The pin 582 is attached by a shoulder area 584 to the tool body 588. As shown in FIG. 6A, the tool length from distal end 586 to shoulder face is $L_1$, the length from distal end 586 to the proximal body face is $L_2$, and the length of the base 589 is $L_3$. The diameter of the tool body 588 is $D_1$. The radius of curvature of the distal end of the shoulder area 584 which abuts the tool body 588 is $R_2$, and the radius of curvature of the proximal end of the tool body 588 is $R_1$. The tool 550 and tool pin 582 can be selected according to the dimensions of the cold plate so that the 550 tool and tool pin 582 can fit between the external ribs and along the shelf perimeter without touching the rib features. In a non-limiting example, the tool 550 of FIG. 6A may have $L_1$=4.25 in., $L_2$=3.75 in., $L_3$=2.00 in, $R_1$=0.06 in, $R_2$=0.12 in, $D_1$=0.9843 (+0.00 or −0.0015) in.

FIGS. 5 and 6B-6C show enlarged views of the pin 582. The pin 582 can have threads 583 configured with one or more flutes 584. The flutes 584 can aid in material flow during welding. The pin 582 may be provided with flutes or without flutes. As noted above, the dimensions of the pin 582 can be such that the tool pin 582 can fit between the external ribs and along the shelf perimeter without touching the rib features.

Figure 7:
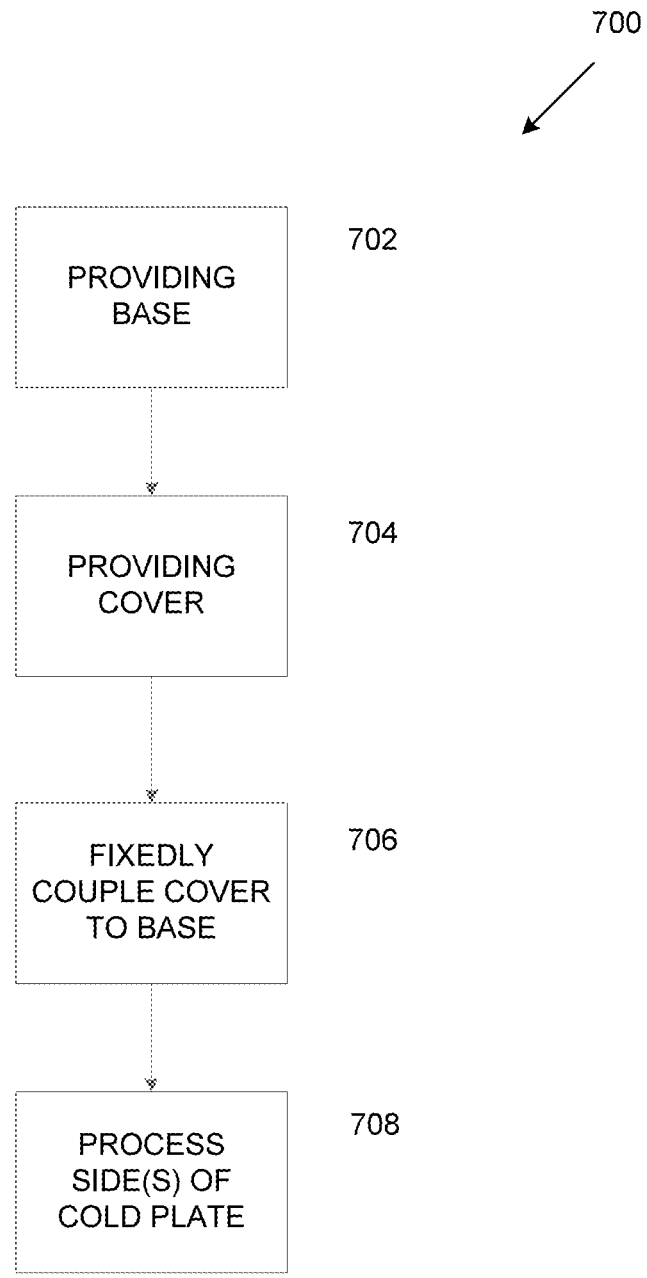
FIG. 7 is a flow chart of a method according to one or more embodiments of the disclosed subject matter.

FIG. 7 is a flow chart of a method 700 according to one or more embodiments of the disclosed subject matter.

The method 700 can include, at operation 702, providing a base according to embodiments of the disclosed subject matter, such as those described above with respect to FIGS. 1-4B. The providing at operation 702 can include machining the base into the desired configuration or geometry, including opposing surfaces, for registering and being fixedly coupled to the cover.

The method 700 can also include, at operation 704, providing a cover according to embodiments of the disclosed subject matter, such as those described above with respect to FIGS. 1-4B. Optionally, operation 704 can be performed before operation 702, or operation 704 can be performed at the same time as operation 702. The providing at operation 704 can include machining the cover into the desired configuration or geometry, including opposing surfaces, for registering and being fixedly coupled to the base.

The method 700 can also include, at operation 706, coupling the cover to the base. The coupling can first include coupling the cover to the base such that the cover resides or rests on the lip and the tabs are registered with corresponding slots.

Once the cover has been coupled to the base, the cover can be tack welded to the base via welding at the interfaces of the tabs and slots. As noted above, such welding can occur on both sides of the cold plate, since tabs can be provided at both sides of the cold plate. Such welding can be performed according to friction stir welding using a friction stir welding tool, such as shown in FIG. 5.

The perimeter of the cover can be friction stir welded with a full penetration pin tool in a continuous operation to the edge of the cover plate forming flow paths between adjacent internal ribs. According to one or more embodiments, the perimeter welding can be completed in a single operation or pass, for instance, to minimize or avoid leaving indentations where the operation stops and then starts again. The perimeter of the cover may first be friction stir tack welded to the base using a partial penetration friction stir tack welding pin in a single operation and secondly friction stir welded using a full penetration friction stir welding head in a single operation.

Optionally, after the cover is fixedly coupled to the base, at operation 708, one or more sides of the cold plate may be processed to remove the sacrificial ribs thereon. Such processing may include machining, for instance, grinding or planing. The cold plate can be machined by removing layer by layer of material at incremental depths until each surface is smooth. Such processing may also include polishing or smoothing one or more sides of the cold plate. The finished cold plate can have the form of the cold plate 100 of FIG. 1, for instance.

Control aspects of the present disclosure, such as operations controlled or performed by controller 505, including operations associated with fixedly coupling the cover to the base in operation 706 of method 700 and/or processing side(s) of the cold plate in operation 708 of method 700, may take the form of an entirely hardware embodiment, an entirely software embodiment (including firmware, resident software, microcode, etc.) or an embodiment combining software and hardware aspects that may all generally be referred to herein as a "circuit," "circuitry," "module" or "system." Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, device, or portion thereof.

The above-described hardware description is a non-limiting example of corresponding structure for performing the functionality described herein.

Embodiments of the disclosed subject matter may also be as set forth according to the parentheticals in the following paragraphs.

(1) A method for manufacturing a cold plate assembly, comprising: machining a base plate to have spaced sacrificial ribs on a first side and spaced internal ribs on a second side opposing the first side; machining a cover plate to have spaced outer sacrificial ribs on a third side and spaced internal ribs on a fourth side opposing the third side; further machining the base plate to form a perimeter wall perpendicular to the first side, the perimeter wall including a lip defining a reception area for a perimeter edge of the cover plate, wherein the reception area has a length and a width equal to a length and width of the reception area; forming a first plurality of spaced tabs on each internal rib of the second side of the base plate; forming a second plurality of spaced tabs on each internal rib of the fourth side of the cover plate; forming a plurality of spaced slots through the base plate between the sacrificial ribs of the first side, wherein each slot is spaced so as to register with a corresponding tab of the fourth side; forming a plurality of spaced slots through the cover plate between the sacrificial ribs of the third side, wherein each slot is spaced so as to register with a corresponding tab of the second side; inserting each tab of the second side into the corresponding slot of the third side; inserting each tab of the fourth side into the corresponding slot of the first side; pressing the perimeter edge of the cover plate to contact the lip; friction stir welding, with a pin tool head, between the spaced sacrificial ribs of the first side and the third side, wherein friction stir welding melds each tab to a corresponding slot and forms flow paths between adjacent internal ribs; friction stir welding, with a full penetration friction stir welding head, the perimeter edge of the base plate to the cover plate; and removing, by a milling machine, the sacrificial ribs of the cover plate and the base plate.

(2) The method for manufacturing a cold plate according to (1), further comprising friction stir welding the perimeter edge in a single welding operation.

(3) The method for manufacturing a cold plate according to (1) or (2), further comprising forming the tabs and slots by shaping rectangular tabs and drilling rectangular slots.

(4) The method for manufacturing a cold plate according any one of (1) to (3), further comprising forming the tabs and slots by shaping cylindrical tabs and drilling cylindrical slots.

(5) The method for manufacturing a cold plate according any one of (1) to (4), further comprising machining the base plate and cover plate from a material selected from the group comprising aluminum, copper, silver and alloys of copper and silver.

(6) The method for manufacturing a cold plate according any one of (1) to (5), further comprising machining the base plate and cover plate from aluminum.

(7) The method for manufacturing a cold plate according any one of (1) to (6), further comprising polishing, by the milling machine, the external surfaces of the cold plate assembly.

(8) The method for manufacturing a cold plate according any one of (1) to (7), further comprising machining by computer numerical control.

(9) A cold plate pre-welding assembly, comprising: a base plate having spaced sacrificial ribs on a first side and spaced internal ribs on a second side opposing the first side; a cover plate having spaced sacrificial ribs on a third side and spaced internal ribs on a fourth side opposing the third side; the base plate having a perimeter edge region including a lip configured to define a reception area for an edge of the cover plate, wherein the reception area has a length and a width equal to a length and width of the cover plate; a first plurality of spaced tabs located on each internal rib of the second side of the base plate; a second plurality of spaced tabs located on each internal rib of the fourth side of the cover plate; a first plurality of spaced slots located between the sacrificial ribs of the first side, wherein each slot is located so as to register with and receive a corresponding tab of the fourth side; a second plurality of spaced slots located between the sacrificial ribs of the third side, wherein each slot is located so as to register with and receive a corresponding tab of the second side; wherein each said tab inserted into the corresponding slot is friction stir tack welded to the first or the second side, respectively, such that the internal ribs of the cover plate are welded through and to the base plate and the internal ribs of the base plate are welded through and to the cover plate thereby forming flow paths between adjacent internal ribs; wherein the perimeter edge of the first side of the base plate is first friction stir tack welded, using a partial penetration pin tool, to the edge of the cover plate, and secondly friction stir welded with a full penetration pin tool in a continuous operation to the edge of the cover plate; wherein the sacrificial ribs are configured to be removed by milling.

(10) The cold plate pre-welding assembly according to (9), wherein each tab in each of the base plate and cover plate is rectangular and each slot is a rectangular hole.

(11) The cold plate pre-welding assembly according to (9) or (10), wherein each tab in each of the base plate and cover plate is cylindrical and each slot is a cylindrical hole.

(12) The cold plate pre-welding assembly according to any one of (9) to (11), wherein materials of the base plate and the cover plate are selected from the group comprising aluminum, copper, silver and alloys of copper and silver.

(13) The cold plate pre-welding assembly according to any one of (9) to (12), wherein material of the base plate and the cover plate are aluminum.

(14) A method for assembling a cold plate, comprising: connecting internal ribs on a first side of a base plate to a second side of a cover plate; connecting internal ribs on a third side of the cover plate to a fourth side of the base plate; pressing an edge of the third side of the cover plate to contact a lip in a perimeter edge of a sidewall of the base plate; friction stir welding the perimeter edge of the base plate to the cover plate to form flow paths between adjacent internal ribs; removing, by milling, sacrificial ribs from the second side of the cover plate and the fourth side of the base plate.

(15) The method for assembling a cold plate according to (14), connecting internal ribs on the first side of the base plate to the second side of the cover plate by machining tabs at spaced locations on each internal rib; drilling holes at corresponding locations through the cover plate; inserting each tab into each corresponding hole; and friction stir welding each tab to the second side of the cover plate.

(16) The method for assembling a cold plate according to any one of (14) to (15), connecting internal ribs on the third side of the cover plate to the fourth side of the base plate by machining tabs at spaced locations on each internal rib; drilling holes at corresponding locations through the base plate; inserting each tab into each corresponding hole; and friction stir welding each tab to the fourth side of the base plate.

(17) The method for assembling a cold plate according to any one of (14) to (16), further comprising: connecting internal ribs on the first side of the base plate to the second side of the cover plate by drilling holes through the cover plate; drilling threaded holes at corresponding locations in each internal rib of the first side of the base plate; inserting a threaded screw into each hole in the second side of the cover plate; rotating each screw into a corresponding threaded hole in the internal rib of the base plate; and friction stir welding a top of each screw to the cover plate.

(18) The method for assembling a cold plate according to any one of (14) to (17), further comprising: connecting internal ribs on the third side of the cover plate to the fourth side of the base plate by drilling holes through the base plate; drilling threaded holes at corresponding locations in each internal rib of the first side of the base plate; inserting a threaded screw into each hole in the fourth side of the base plate; rotating each screw into a corresponding threaded hole in the internal rib of the third side of the cover plate; and friction stir welding a top of each screw on the fourth side of the base plate.

(19) The method for assembling a cold plate according to any one of (14) to (18), further comprising friction stir welding with a full penetration friction stir welding head, the perimeter edge of the base plate to the cover plate.

(20) The method for assembling a cold plate according to (18), further comprising friction stir welding the top of each screw using a pin head tool.

(21) A method for manufacturing a cold plate assembly, comprising: machining a base plate to have a first set of spaced outer sacrificial ribs on a first side and a first set of spaced internal ribs on a second side opposing the first side; machining a cover plate to have a second set of spaced outer sacrificial ribs on a third side and a second set of spaced internal ribs on a fourth side opposing the third side; machining the first side of the base plate to form an inner perimeter wall, the perimeter wall including a lip defining a reception area for a perimeter edge of the cover plate; forming a first plurality of spaced tabs on each said internal rib of the base plate; forming a second plurality of spaced tabs on each said internal rib of the cover plate; forming a first plurality of spaced slots through the base plate between adjacent pairs of the outer and internal sacrificial ribs, wherein each said slot of the first plurality of slots is spaced so as to register with a corresponding tab of the second plurality of tabs; forming a second plurality of spaced slots through the cover plate between adjacent pairs of the outer and internal sacrificial ribs, wherein each said slot of the second plurality of slots is spaced so as to register with a corresponding tab of the first plurality of tabs; inserting each said tab of the first plurality of tabs into the corresponding slot of the second plurality of slots; inserting each said tab of the second plurality of tabs into the corresponding slot of the first plurality of slots; fitting the perimeter edge of the cover plate within the lip of the perimeter wall; wherein each said tab inserted into the corresponding slots is friction stir tack welded, using a pin tool head, between the spaced outer sacrificial ribs of the first side and the third side, such that the internal ribs of the cover plate are welded through the base plate and the internal ribs of the base plate are welded through the cover plate thereby forming flow paths between adjacent internal ribs; wherein the perimeter edge of the first side of the base plate is first friction stir tack welded, using a partial penetration pin tool, to the edge of the cover plate, and secondly friction stir welded with a full penetration pin tool in a continuous operation to the edge of the cover plate; and removing, by a milling machine, the outer sacrificial ribs of the cover plate and the base plate.

(22) The method for manufacturing a cold plate according to (21), wherein said friction stir welding the perimeter edge to the base plate is performed in a single welding operation.

(23) The method for manufacturing a cold plate according to (21) or (22), wherein said forming the tabs and the slots includes shaping rectangular tabs and drilling rectangular slots.

(24) The method for manufacturing a cold plate according to any one of (21) to (23), wherein one or more flow paths are defined between adjacent ones of the internal ribs of the base plate and cover plate.

(25) The method for manufacturing a cold plate according to any one of (21) to (24), wherein the outer sacrificial ribs are separated from each other in a first direction, the internal ribs are separated from each other in the first direction, and the first plurality of tabs are spaced from each other in a second direction perpendicular to the first direction, and the second plurality of tabs are spaced from each other in the second direction.

(26) The method for manufacturing a cold plate according to any one of (21) to (25), wherein after said removing the outer sacrificial ribs of the cover plate the third side of the cover plate and the second side of the base plate are flush.

(27) The method for manufacturing a cold plate according to any one of (21) to (26), further comprising after said removing the outer sacrificial ribs of the cover plate and the base plate polishing, by the milling machine, resultant external surfaces of the cold plate assembly at the first side of the base plate, the second side of the base plate, and the third side of the cover plate.

(28) The method for manufacturing a cold plate according to any one of (21) to (27), wherein said machining and/or said friction stir welding is/are performed by computer numerical control according to programming instructions stored on a non-transitory computer-readable storage medium that, when executed by a controller, perform said machining and/or said friction stir welding.

(29) A cold plate assembly, comprising: a base plate having spaced external sacrificial ribs on a first side and spaced internal ribs on a second side opposing the first side, the internal ribs being at least partially aligned with respective ones of the external ribs in a thickness direction of the base plate; a cover plate having spaced external sacrificial ribs on a third side and spaced internal ribs on a fourth side opposing the third side, the internal ribs being at least partially aligned with respective ones of the external ribs in a thickness direction of the cover plate, the base plate having a ledge that defines a reception area configured to receive a perimeter edge of the cover plate; a first plurality of spaced tabs located on each said internal rib of the base plate, each said tab of the first plurality of tabs extending from the corresponding internal rib in the thickness direction of the base plate; a second plurality of spaced tabs located on each said internal rib of the cover plate, each said tab of the second plurality of tabs extending from the corresponding internal rib in the thickness direction of the cover plate; a first plurality of spaced slots located between adjacent pairs of the external and internal sacrificial ribs of the base plate, wherein each said slot of the first plurality of slots is located so as to register with and receive a corresponding tab of the internal ribs of the cover plate; and a second plurality of spaced slots located between adjacent pairs of the external and internal sacrificial ribs of the cover plate, wherein each said slot of the second plurality of slots is located so as to register with and receive a corresponding tab of the internal ribs of the base plate, wherein each said tab, when inserted into a corresponding one of the slots, is configured to be friction stir welded to fixedly couple the cover plate to the base plate, and wherein the perimeter edge of the cover plate, when received in the ledge of the base plate, is configured to be friction stir welded to the ledge of the base plate.

(30) The cold plate assembly according to (29), wherein each said tab in each of the base plate and cover plate is rectangular and each said slot is a rectangular hole, and wherein each of the base plate and the cover plate being elongate rectangular in a plan view, the cover plate being less in area in the plan view than the base plate.

(31) The cold plate assembly according to (29) or (30), wherein each said tab is inserted into the corresponding one of the slots and the perimeter edge of the cover plate is received in the ledge of the base plate thereby forming at least one flow path formed by alternating internal ribs of the cover plate and the base plate.

(32) The cold plate assembly according to any one of (29) to (31), wherein a material of the base plate and/or the cover plate is/are selected from the group comprising aluminum, copper, silver, and alloys of copper or silver.

(33) The cold plate assembly according to any one of (29) to (32), wherein the external sacrificial ribs on the third side extend to a height above an extreme-most surface at a peripheral portion of the base plate on the second side.

(34) A method for assembling a cold plate, comprising: connecting ribs on a first side of a base plate to a cover plate; connecting ribs on a second side of the cover plate facing the first side of the base plate to the base plate; and fitting a side edge portion of the cover plate on a lip of an inner sidewall of the base plate.

(35) The method for assembling a cold plate according to (34), further comprising friction stir welding the side edge of the cover plate to the base plate.

(36) The method for assembling a cold plate according to (34) or (35), further comprising friction stir welding the ribs of the base plate to the cover plate and/or friction stir welding the ribs of the cover plate to the base plate.

(37) The method for assembling a cold plate according to any one of (34) to (36), wherein said connecting ribs on the first side of the base plate to the cover plate includes: fitting a plurality of first tabs extending from each of the ribs of the base plate into corresponding spaced apart slots formed in the cover plate; and fitting a plurality of second tabs extending from each of the ribs of the cover plate into corresponding spaced apart slots formed in the base plate.

(38) The method for assembling a cold plate according to any one of (34) to (37), further comprising: friction stir welding the first tabs in the slots of the cover plate to the cover plate; and friction stir welding the second tabs in the slots of the base plate to the base plate.

(39) The method for assembling a cold plate according to any one of (34) to (38), further comprising, after said friction stir welding, milling sacrificial external ribs formed on opposing sides of the base plate and/or the cover plate.

(40) The method for assembling a cold plate according to any one of (34) to (39), wherein a flow channel is formed between each pair of adjacent ribs of the base plate and the cover plate.

(41) A method for manufacturing a cold plate assembly, comprising: providing a base plate including: a first set of spaced outer sacrificial ribs on a first side and a first set of spaced internal ribs on a second side opposing the first side, an inner perimeter wall having a lip defining a reception area for a perimeter edge of the cover plate, a first plurality of spaced tabs on each said internal rib of the base plate, and a first plurality of spaced slots through the base plate between adjacent pairs of the outer and internal sacrificial ribs; providing a cover plate including: a second set of spaced outer sacrificial ribs on a third side and a second set of spaced internal ribs on a fourth side opposing the third side, a second plurality of spaced tabs on each said internal rib of the cover plate, and a second plurality of spaced slots through the cover plate between adjacent pairs of the outer and internal sacrificial ribs, wherein each said slot of the second plurality of slots is spaced so as to register with a corresponding tab of the first plurality of tabs, and wherein each said slot of the first plurality of slots is spaced so as to register with a corresponding tab of the second plurality of tabs; inserting each said tab of the first plurality of tabs into the corresponding slot of the second plurality of slots; inserting each said tab of the second plurality of tabs into the corresponding slot of the first plurality of slots; fitting the perimeter edge of the cover plate within the lip of the perimeter wall; friction stir tack welding, with a partial penetration pin tool head, between the spaced outer sacrificial ribs of the first side and the third side, wherein said friction stir tack welding melds each said tab to a corresponding slot; friction stir welding, with a full penetration friction stir welding pin tool head, with the perimeter edge of the cover plate within the lip of the perimeter wall, the perimeter edge of the cover plate to the base plate; and removing, by a milling machine, the outer sacrificial ribs of the cover plate and the base plate.

(42) The method for manufacturing a cold plate assembly according to (41), wherein said friction stir welding the perimeter edge to the base plate is performed in a single welding operation.

(43) The method for manufacturing a cold plate assembly according to (41) or (42), further comprising forming the tabs and the slots.

(44) The method for manufacturing a cold plate assembly according to any one of (41) to (43), wherein one or more flow paths are defined between adjacent ones of the internal ribs of the base plate and cover plate.

(45) The method for manufacturing a cold plate assembly according to any one of (41) to (44), wherein the outer sacrificial ribs are separated from each other in a first direction, the internal ribs are separated from each other in the first direction, and the first plurality of tabs are spaced from each other in a second direction perpendicular to the first direction, and the second plurality of tabs are spaced from each other in the second direction.

(46) The method for manufacturing a cold plate assembly according to any one of (41) to (45), wherein after said removing the outer sacrificial ribs of the cover plate the third side of the cover plate and the second side of the base plate are flush.

(47) The method for manufacturing a cold plate assembly according to any one of (41) to (46), further comprising after said removing the outer sacrificial ribs of the cover plate and the base plate polishing, by a milling machine, resultant external surfaces of the cold plate assembly at the first side of the base plate, the second side of the base plate, and the third side of the cover plate.

(48) The method for manufacturing a cold plate assembly according to any one of (41) to (47), wherein said providing the cover plate and said providing the base plate each include machining to create the external ribs by computer numerical control according to programming instructions stored on a non-transitory computer-readable storage medium that, when executed by a controller, perform said machining and/or said friction stir welding.

(49) A cold plate assembly, comprising a base plate having spaced external sacrificial ribs on a first side and spaced internal ribs on a second side opposing the first side, the internal ribs being at least partially aligned with respective ones of the external ribs in a thickness direction of the base plate; a cover plate having spaced external sacrificial ribs on a third side and spaced internal ribs on a fourth side opposing the third side, the internal ribs being at least partially aligned with respective ones of the external ribs in a thickness direction of the cover plate, the base plate having a ledge that defines a reception area configured to receive a perimeter edge of the cover plate; a first plurality of spaced tabs located on each said internal rib of the base plate, each said tab of the first plurality of tabs extending from the corresponding internal rib in the thickness direction of the base plate; a second plurality of spaced tabs located on each said internal rib of the cover plate, each said tab of the second plurality of tabs extending from the corresponding internal rib in the thickness direction of the cover plate; a first plurality of spaced slots located between adjacent pairs of the external and internal sacrificial ribs of the base plate, wherein each said slot of the first plurality of slots is located so as to register with and receive a corresponding tab of the internal ribs of the cover plate; and a second plurality of spaced slots located between adjacent pairs of the external and internal sacrificial ribs of the cover plate, wherein each said slot of the second plurality of slots is located so as to register with and receive a corresponding tab of the internal ribs of the base plate, wherein each said tab, when inserted into a corresponding one of the slots, is configured to be friction stir tack welded to fixedly couple the cover plate to the base plate, and wherein the perimeter edge of the cover plate, when received in the ledge of the base plate, is configured to be friction stir welded to the ledge of the base plate.

(50) The cold plate assembly according to (49), wherein each said tab in each of the base plate and cover plate is rectangular and each said slot is a rectangular hole, and wherein each of the base plate and the cover plate being elongate rectangular in a plan view, the cover plate being less in area in the plan view than the base plate.

(51) The cold plate assembly according to (49) or (50), wherein each said tab is inserted into the corresponding one of the slots and the perimeter edge of the cover plate is received in the ledge of the base plate thereby forming at least one flow path formed by alternating internal ribs of the cover plate and the base plate.

(52) The cold plate assembly according to any one of (49) to (51), wherein a material of the base plate and/or the cover plate is/are selected from the group comprising aluminum, copper, silver, and alloys of copper or silver.

(53) The cold plate assembly according to any one of (49) to (52), wherein the external sacrificial ribs on the third side extend to a height above an extreme-most surface at a peripheral portion of the base plate on the second side.

(54) A method for assembling a cold plate, comprising: connecting ribs on a first side of a base plate to a cover plate; connecting ribs on a second side of the cover plate facing the first side of the base plate to the base plate; and fitting a side edge portion of the cover plate on a lip of an inner sidewall of the base plate.

(55) The method for assembling a cold plate according to (54), further comprising friction stir welding the side edge of the cover plate to the base plate.

(56) The method for assembling a cold plate according to (54) or (55), further comprising friction stir tack welding the ribs of the base plate to the cover plate and/or friction stir tack welding the ribs of the cover plate to the base plate.

(57) The method for assembling a cold plate according to any one of (54) to (56), wherein said connecting ribs on the first side of the base plate to the cover plate includes: fitting a plurality of first tabs extending from each of the ribs of the base plate into corresponding spaced apart slots formed in the cover plate; and fitting a plurality of second tabs extending from each of the ribs of the cover plate into corresponding spaced apart slots formed in the base plate.

(58) The method for assembling a cold plate according to any one of (54) to (57), further comprising: friction stir tack welding the first tabs in the slots of the cover plate to the cover plate; and friction stir tack welding the second tabs in the slots of the base plate to the base plate.

(59) The method for assembling a cold plate according to any one of (54) to (58), further comprising, after said friction stir welding, milling sacrificial external ribs formed on opposing sides of the base plate and/or the cover plate.

(60) The method for assembling a cold plate according to any one of (54) to (59), wherein a flow channel is formed between each pair of adjacent ribs of the base plate and the cover plate.

Having now described embodiments of the disclosed subject matter, it should be apparent to those skilled in the art that the foregoing is merely illustrative and not limiting, having been presented by way of example only. Thus, although particular configurations have been discussed and illustrated herein, other configurations can be and are also employed. Further, numerous modifications and other embodiments (e.g., combinations, rearrangements, etc.) are enabled by the present disclosure and are contemplated as falling within the scope of the disclosed subject matter and any equivalents thereto. Features of the disclosed embodiments can be combined, rearranged, omitted, etc., within the scope of described subject matter to produce additional embodiments. Furthermore, certain features may sometimes be used to advantage without a corresponding use of other features. Accordingly, Applicant intends to embrace all such alternatives, modifications, equivalents, and variations that are within the spirit and scope of the present disclosure. Further, it is therefore to be understood that within the scope of the appended claims, the disclosure may be practiced otherwise than as specifically described herein.

The invention claimed is:

1. A method for manufacturing a cold plate assembly, comprising:
    providing a base plate including:
        a first set of spaced outer sacrificial ribs on a first side and a first set of spaced internal ribs on a second side opposing the first side,
        an inner perimeter wall having a lip defining a reception area for a perimeter edge of a cover plate,
        a first plurality of spaced tabs on each said internal rib of the base plate, and
        a first plurality of spaced slots through the base plate between adjacent pairs of the outer sacrificial and internal ribs;
    providing a cover plate including:
        a second set of spaced outer sacrificial ribs on a third side and a second set of spaced internal ribs on a fourth side opposing the third side,
        a second plurality of spaced tabs on each said internal rib of the cover plate, and
        a second plurality of spaced slots through the cover plate between adjacent pairs of the outer sacrificial and internal ribs,
        wherein each said slot of the second plurality of slots is spaced so as to register with a corresponding tab of the first plurality of tabs, and
        wherein each said slot of the first plurality of slots is spaced so as to register with a corresponding tab of the second plurality of tabs;
    inserting each said tab of the first plurality of tabs into the corresponding slot of the second plurality of slots;
    inserting each said tab of the second plurality of tabs into the corresponding slot of the first plurality of slots;
    fitting the perimeter edge of the cover plate within the lip of the perimeter wall;
    friction stir tack welding, with a partial penetration pin tool head, between the spaced outer sacrificial ribs of the first side and the third side, wherein said friction stir tack welding melds each said tab to a corresponding slot;
    friction stir welding, with a full penetration friction stir welding pin tool head, with the perimeter edge of the cover plate within the lip of the perimeter wall, the perimeter edge of the cover plate to the base plate; and
    removing, by a milling machine, the outer sacrificial ribs of the cover plate and the base plate.

2. The method for manufacturing a cold plate according to claim 1, wherein said friction stir welding the perimeter edge to the base plate is performed in a single welding operation.

3. The method for manufacturing a cold plate according to claim 1, further comprising forming the tabs and the slots.

4. The method for manufacturing a cold plate according to claim 1, wherein one or more flow paths are defined between adjacent ones of the internal ribs of the base plate and cover plate.

5. The method for manufacturing a cold plate according to claim 1, wherein the outer sacrificial ribs are separated from each other in a first direction, the internal ribs are separated from each other in the first direction, and the first plurality of tabs are spaced from each other in a second direction perpendicular to the first direction, and the second plurality of tabs are spaced from each other in the second direction.

6. The method for manufacturing a cold plate according to claim 1, wherein after said removing the outer sacrificial ribs of the cover plate the third side of the cover plate and the second side of the base plate are flush.

7. The method for manufacturing a cold plate according to claim 1, further comprising after said removing the outer sacrificial ribs of the cover plate and the base plate polishing, by a milling machine, resultant external surfaces of the cold plate assembly at the first side of the base plate, the second side of the base plate, and the third side of the cover plate.

8. The method for manufacturing a cold plate according to claim 1, wherein said providing the cover plate and said providing the base plate each include machining to create the external ribs by computer numerical control according to programming instructions stored on a non-transitory computer-readable storage medium that, when executed by a controller, perform said friction stir welding and/or said friction stir tack welding.

9. A method for assembling a cold plate, comprising:
    providing a base plate with a first side, a second side, and a plurality of ribs extending from the first side of the base plate, the base plate further comprising an inner sidewall forming a lip on the first side, a plurality of tabs extending from each of the ribs of the base plate and a plurality of spaced apart slots formed in the first side of the base plate, the slots positioned between adjacent pairs of the plurality of ribs;
    providing a cover plate with a first side, a second side, and ribs extending from the second side of the cover plate, the cover plate further comprising a side edge portion extending between the first side and the second side of the cover plate, a plurality of spaced apart slots formed in the cover plate, the slots positioned between adjacent pairs of the plurality of ribs, and a plurality of tabs extending from each of the ribs of the cover plate;
    fitting the side edge portion of the cover plate on the lip of the inner sidewall of the base plate, wherein the ribs on the first side of the base plate abut the second side of the cover plate and the ribs on the second side of the cover plate abut the first side of the base plate such that the ribs of the base plate and the ribs of the cover plate are laterally offset from each other;
    fitting the plurality of first tabs extending from the ribs of the base plate into corresponding slots formed in the cover plate;
    fitting the plurality of second tabs extending from the ribs of the cover plate into the corresponding slots formed in the base plate;
    connecting the first tabs extending from the ribs on the first side of the base plate to the slots formed in the second side of the cover plate in order to couple the base plate to the cover plate;
connecting the second tabs extending from the ribs on the second side of the cover plate facing the first side of the base plate to the slots formed in the first side of the base plate in order to couple the base plate to the cover plate.

10. The method for assembling a cold plate according to claim 9, further comprising friction stir welding the side edge of the cover plate to the base plate.

11. The method for assembling a cold plate according to claim 9, further comprising friction stir tack welding the ribs of the base plate to the cover plate and/or friction stir tack welding the ribs of the cover plate to the base plate.

12. The method for assembling a cold plate according to claim 9, wherein connecting the first tabs extending from the ribs on the first side of the base plate to the slots formed in the second side of the cover plate comprises
friction stir tack welding the first tabs in the slots of the cover plate to the cover plate and
connecting the second tabs extending from the ribs on the second side of the cover plate facing the first side of the base plate to the slots formed in the first side of the base plate comprises friction stir tack welding the second tabs in the slots of the base plate to the base plate.

13. The method for assembling a cold plate according to claim 9, wherein a set of sacrificial external ribs are positioned on the second side of the base plate and a second set of sacrificial external ribs are positioned on a first side of the cover plate.

14. The method for assembling a cold plate according to claim 9, wherein a flow channel is formed between each pair of adjacent ribs of the base plate and the cover plate.

15. The method for assembling a cold plate according to claim 13, further comprising, after said friction stir welding, milling sacrificial external ribs formed on opposing sides of the base plate and the cover plate.

* * * * *